(12) United States Patent
Yorita et al.

(10) Patent No.: US 10,483,983 B2
(45) Date of Patent: Nov. 19, 2019

(54) CLOCK GENERATING CIRCUIT AND SIGNAL PROCESSING DEVICE

(71) Applicant: NIHON DEMPA KOGYO CO., LTD., Tokyo (JP)

(72) Inventors: Tomoya Yorita, Saitama (JP); Shoichi Tsuchiya, Saitama (JP); Yasuo Kitayama, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 302 days.

(21) Appl. No.: 15/683,788

(22) Filed: Aug. 23, 2017

(65) Prior Publication Data
US 2018/0076818 A1 Mar. 15, 2018

(30) Foreign Application Priority Data
Sep. 9, 2016 (JP) ................................. 2016-176250

(51) Int. Cl.
| | |
|---|---|
| G06F 1/10 | (2006.01) |
| H03L 1/02 | (2006.01) |
| G06F 1/08 | (2006.01) |
| H03K 21/10 | (2006.01) |
| H03L 7/18 | (2006.01) |

(52) U.S. Cl.
CPC ............... *H03L 1/027* (2013.01); *G06F 1/08* (2013.01); *G06F 1/10* (2013.01); *H03K 21/10* (2013.01); *H03L 7/18* (2013.01)

(58) Field of Classification Search
CPC ............. H03L 1/027; H03K 21/02–10; G06F 1/04–10
See application file for complete search history.

(56) References Cited

U.S. PATENT DOCUMENTS

| | | | | |
|---|---|---|---|---|
| 6,759,886 | B2 * | 7/2004 | Nakanishi | G06F 1/06 327/115 |
| 8,760,325 | B2 * | 6/2014 | Ryan | G06F 5/06 341/61 |
| 9,515,686 | B2 * | 12/2016 | Kim | H04B 1/0483 |
| 9,716,511 | B1 * | 7/2017 | Yorita | H03M 1/0624 |

FOREIGN PATENT DOCUMENTS

JP 2003037485 2/2003

* cited by examiner

*Primary Examiner* — Patrick O Neill
(74) *Attorney, Agent, or Firm* — JCIPRNET

(57) ABSTRACT

A clock generating circuit includes a dividing unit and a distribution unit. The dividing unit divides a reference clock to generate a divided clock, and the divided clock has a frequency of 1/N times of a frequency of the reference clock, where N is an integer of two or more. The distribution unit distributes the reference clock to a first route and a second route, the first route includes an output terminal that outputs a clock with a frequency identical to the frequency of the reference clock, and the second route includes the dividing unit. The dividing unit includes one or more amplifiers, one or more dividing circuits, and a correction circuit. The correction circuit is disposed between the amplifier and the dividing circuit, and the correction circuit corrects a level of an input clock input to the dividing circuit.

5 Claims, 5 Drawing Sheets

CLOCK GENERATING CIRCUIT AND SIGNAL PROCESSING DEVICE

CROSS-REFERENCE TO RELATED APPLICATIONS

This application is based on and claims priority under 35 U.S.C. § 119 to Japanese Patent Application No. 2016-176250, filed on Sep. 9, 2016, the entire content of which is incorporated herein by reference.

TECHNICAL FIELD

This disclosure relates to a clock generating circuit that generates a plurality of clocks, and a signal processing device that executes signal processing with using the plurality of the clocks generated by the clock generating circuit.

DESCRIPTION OF THE RELATED ART

Conventionally, there has been known a circuit that divides a reference clock to generate divided clocks having low frequencies compared with the reference clock. Japanese Unexamined Patent Application Publication No. 2003-37485 discloses a clock generating circuit that divides a reference clock to generate a plurality of clock signals having different frequencies.

Variation of peripheral temperature of a dividing circuit causes, for example, a variation of a gain of an amplifier inside, and a delay period of an output clock to an input reference clock varies. As a result, a circuit located at a latter part using the reference clock and the divided clock is provided a requirement to a time difference between a varying timing of the reference clock and a varying timing of the divided clock, but the requirement sometimes fails to be satisfied, thus it has been a problem.

A need thus exists for a clock generating circuit configured to decrease a variation of a delay period of a divided clock in accordance with a temperature variation.

SUMMARY

According to a first aspect of this disclosure, there is provided a clock generating circuit that includes a dividing unit and a distribution unit. The dividing unit divides a reference clock to generate a divided clock, and the divided clock has a frequency of 1/N times of a frequency of the reference clock, where N is an integer of two or more. The distribution unit distributes the reference clock to a first route and a second route, the first route includes an output terminal that outputs a clock with a frequency identical to the frequency of the reference clock, and the second route includes the dividing unit. The dividing unit includes one or more amplifiers, one or more dividing circuits, and a correction circuit. The correction circuit is disposed between the amplifier and the dividing circuit, and the correction circuit corrects a level of an input clock input to the dividing circuit.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

[Outline of the Embodiment]

Figure 1:
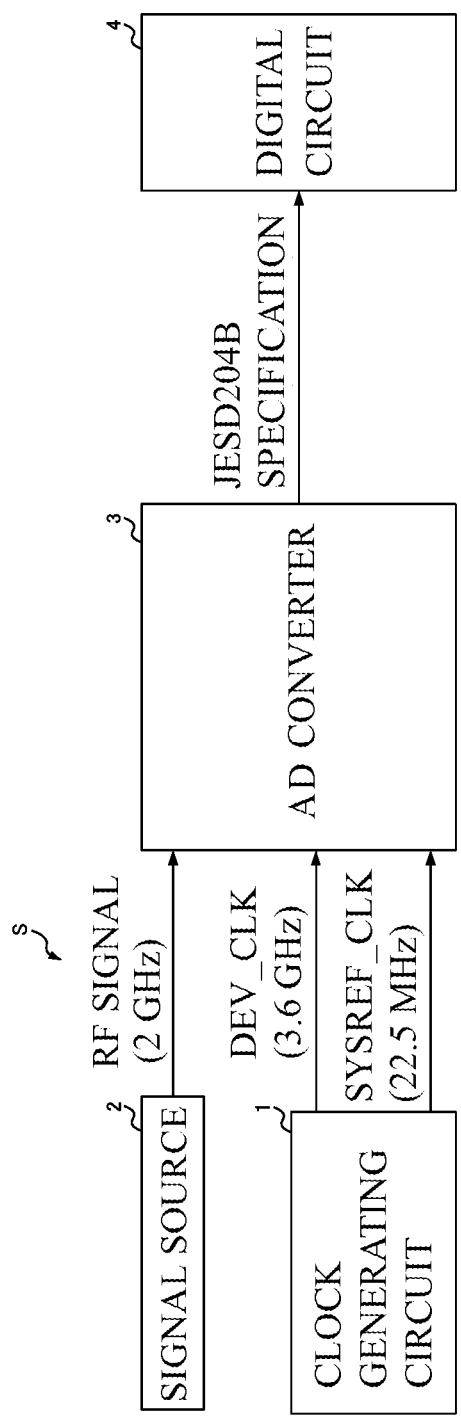
FIG. 1 is a drawing illustrating a configuration of a signal processing device according to the embodiment.

FIG. 1 is a drawing illustrating a configuration of a signal processing device S according to the embodiment. The signal processing device S includes a clock generating circuit 1, a signal source 2, an analog/digital converter 3, and a digital circuit 4. The clock generating circuit 1 outputs a reference clock DEV_CLK (3.6 GHz), which is generated by a built-in reference clock source, and a divided clock SYSREF_CLK (22.5 MHz), which is obtained by dividing the reference clock and has a frequency lower than the frequency of the reference clock. The reference clock and the divided clock, which are output by the clock generating circuit 1, are input to the analog/digital converter 3.

The signal source 2 generates a high frequency signal. A frequency of the high frequency signal generated by the signal source 2 is higher than the frequency of the divided clock and lower than the frequency of the reference clock, and the high frequency signal is, for example, an RF (Radio Frequency) signal of 2 GHz. The RF signal output by the signal source 2 is input to the analog/digital converter 3.

The analog/digital converter 3 converts the RF signal input from the signal source 2 into a digital signal based on the divided clock and the reference clock input from the clock generating circuit 1, and outputs at a timing based on JESD204B specification. The digital signal output from the analog/digital converter 3 is input to the digital circuit 4.

The digital circuit 4 is, for example, an FPGA (Field Programmable Gate Array), and executes various processes based on the input digital signal.

Figure 2:
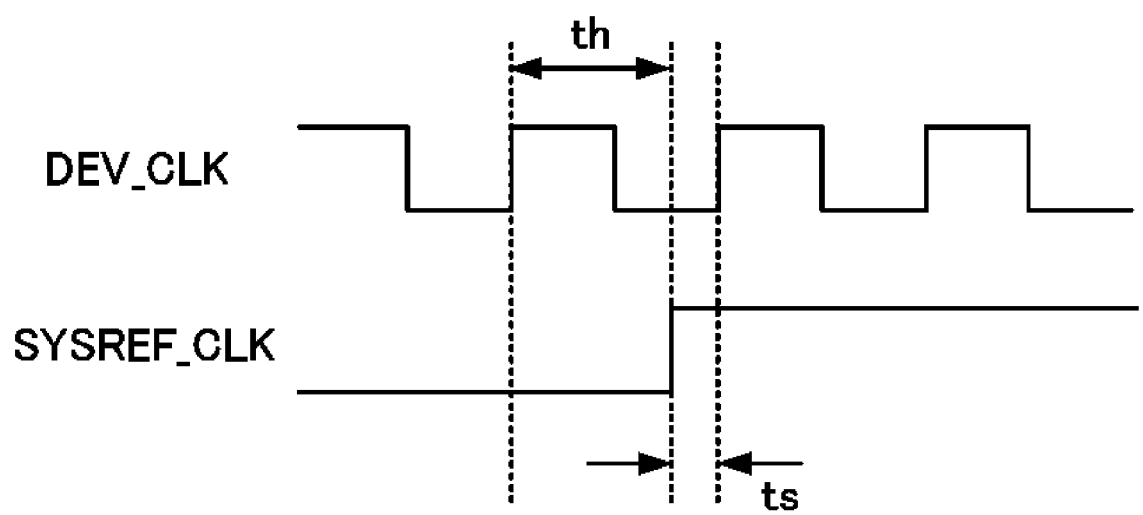
FIG. 2 is a drawing illustrating a relation between a divided clock and a reference clock.

FIG. 2 is a drawing illustrating a relation between the divided clock and the reference clock. In the JESD204B specification, an item (a setup time period and a hold time period) relating to a timing between the DEV_CLK and the SYSREF_CLK is defined. And, if a jitter between the DEV_CLK and the SYSREF_CLK is large, the JESD204B specification can't be satisfied. The setup time period is a time period indicated as "ts" in FIG. 2, and is a time period from a rising timing of the SYSREF_CLK to a rising timing of the DEV_CLK. The hold time period is indicated as "th" in FIG. 2, and is a time period from a rising timing of the DEV_CLK to a rising timing of the SYSREF_CLK.

When the DEV_CLK is 3.6 GHz, a period is 278 ps. JESD204B specification requires the setup time period "ts" and the hold time period "th" to be 60 ps or more. Accordingly, a jitter margin between the DEV_CLK and the SYSREF_CLK is 278 ps−60 ps−60 ps=158 ps. The clock generating circuit 1 according to the embodiment can output a clock that ensures the jitter margin of 158 ps, even when a temperature variation occurs.

[Configuration of Clock Generating Circuit 1]

Figure 3:
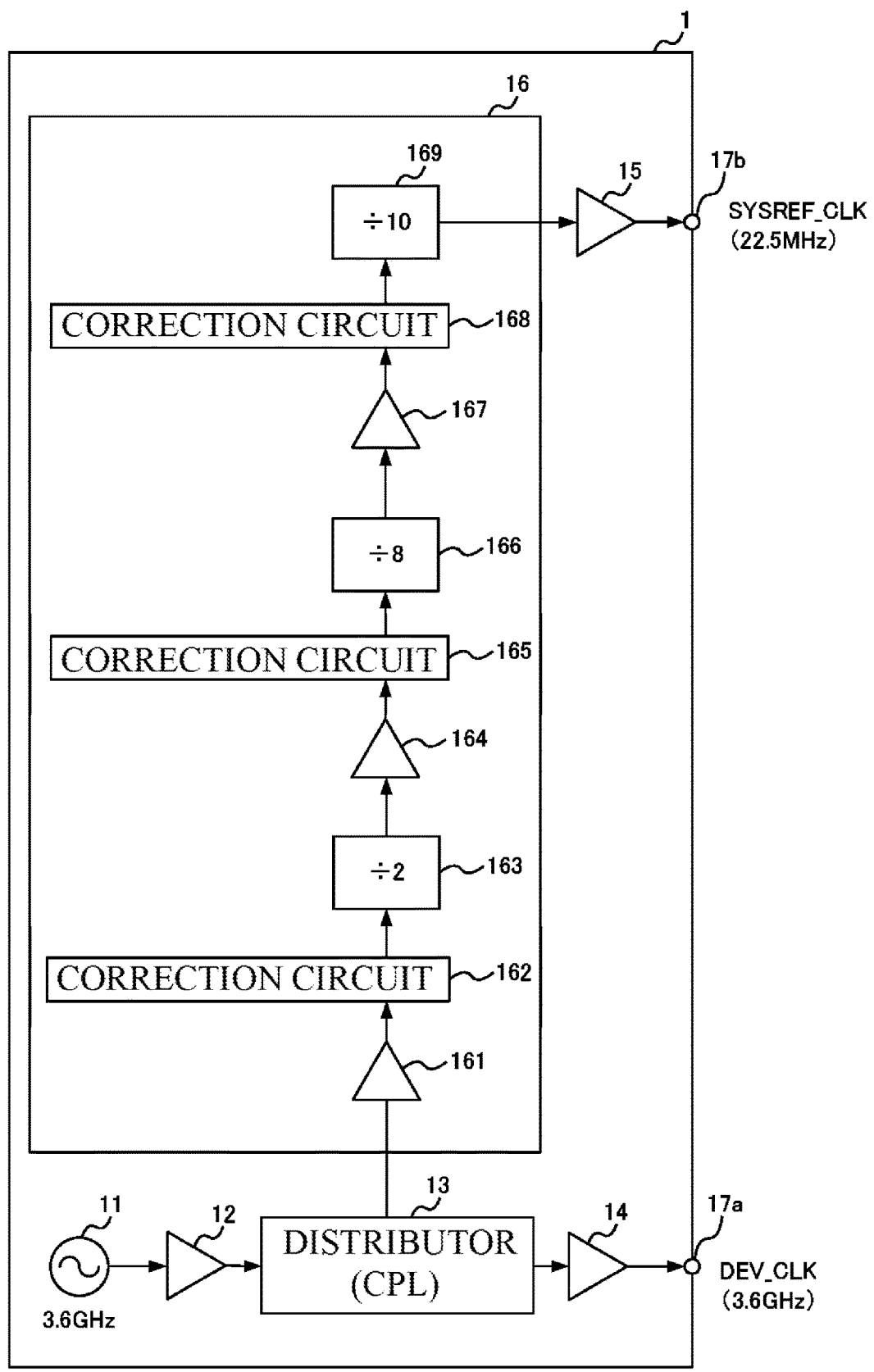
FIG. 3 is a drawing illustrating a configuration of a clock generating circuit of the embodiment.

FIG. 3 is a drawing illustrating a configuration of the clock generating circuit 1 of the embodiment.

The clock generating circuit 1 includes an oscillator 11, an amplifier 12, a distributor 13, an amplifier 14, an amplifier 15, a dividing unit 16, and output terminals 17a and 17b.

The oscillator 11 generates the reference clock to input to the amplifier 12. The reference clock according to the embodiment has a frequency of 3.6 GHz. The oscillator 11 is preferably an oven-controlled crystal oscillator with a little jitter. The amplifier 12 amplifies the reference clock input from the oscillator 11 to input to the distributor 13.

The distributor 13 distributes the reference clock input from the amplifier 12 to the amplifier 14 and the dividing unit 16. That is, the distributor 13 distributes the reference clock to a first route and a second route. The first route outputs a 3.6-GHz DEV_CLK having a frequency identical to the frequency of the reference clock. The second route includes a frequency divider that outputs a 22.5-MHz SYSREF_CLK generated by dividing the 3.6-GHz reference clock.

The amplifier 14 amplifies the 3.6-GHz clock input from the distributor 13 to output from the output terminal 17a as the DEV_CLK.

The amplifier 15 amplifies the 22.5-MHz clock input from the dividing unit 16 to output from the output terminal 17b as the SYSREF_CLK.

The dividing unit 16 generates a divided clock having a frequency of 1/N times (N is an integer of two or more) of the frequency of the reference clock. For example, the dividing unit 16 divides the 3.6-GHz clock input from the distributor 13 by 160 to output the 22.5-MHz clock.

The dividing unit 16 includes one or more amplifiers, one or more dividing circuits, and correction circuits. The correction circuit is disposed between the amplifier and the dividing circuit, and corrects a level of an input clock input to the dividing circuit. The dividing unit 16 including the correction circuit restricts a level variation of a signal output by the amplifier when the temperature variation occurs, thus ensuring the jitter of the SYSREF_CLK with respect to the DEV_CLK to be kept in a predetermined range even when the temperature varies.

Specifically, the dividing unit 16 includes an amplifier 161, a correction circuit 162, a dividing circuit 163, an amplifier 164, a correction circuit 165, a dividing circuit 166, an amplifier 167, a correction circuit 168, and a dividing circuit 169, which are connected in cascade. The amplifier 161, the amplifier 164, and the amplifier 167 have functions equivalent to one another, and amplify the input signal to input the amplified signal to the correction circuit 162, the correction circuit 165, and the correction circuit 168, which are located at the latter parts, respectively.

The correction circuit 162, the correction circuit 165, and the correction circuit 168 are circuits for correcting the level variations that occur on the signals output by the amplifier 161, the amplifier 164, and the amplifier 167 in accordance with the temperature variation. The correction circuit 162, the correction circuit 165, and the correction circuit 168 have properties identical to one another, and have, for example, temperature compensation elements where resistance values vary in accordance with the variation of the temperature.

Figure 4:
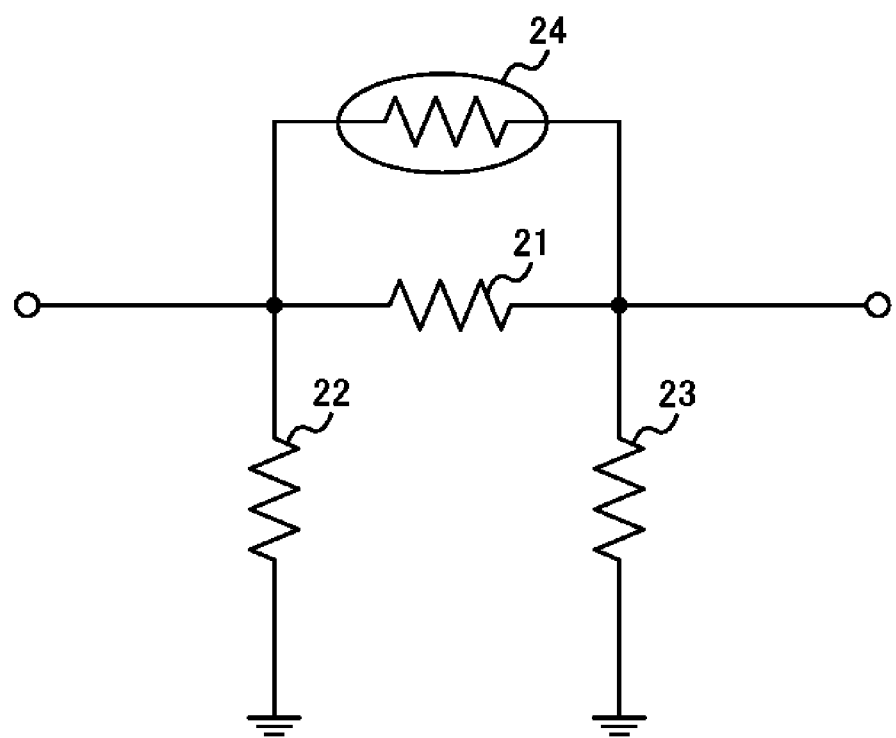
FIG. 4 is a drawing illustrating a configuration of a correction circuit.

FIG. 4 is a drawing illustrating a configuration of the correction circuit 162, the correction circuit 165, and the correction circuit 168. The correction circuit 162, the correction circuit 165, and the correction circuit 168 each include a resistor 21, a resistor 22, a resistor 23, and a thermistor 24. The thermistor 24 is an element whose resistance value decreases as the temperature increases. The correction circuit 162, the correction circuit 165, and the correction circuit 168 including the thermistor 24 decrease series resistances of the correction circuit 162, the correction circuit 165, and the correction circuit 168 as the temperature increases.

The amplifier 161, the amplifier 164, and the amplifier 167 have tendency to decrease the gains as the temperature increases and increase the gains as the temperature decreases. The correction circuit 162, the correction circuit 165, and the correction circuit 168 decrease the series resistance as the temperature increases, thus ensuring the increase of the signal level decreased in accordance with the decrease of the gains of the amplifier 161, the amplifier 164, and the amplifier 167. The correction circuit 162, the correction circuit 165, and the correction circuit 168 increase the series resistance as the temperature decreases, thus ensuring the decrease of the signal level increased in accordance with the increase of the gains of the amplifier 161, the amplifier 164, and the amplifier 167.

The dividing circuit 163, the dividing circuit 166, and the dividing circuit 169 divide the signals input from the correction circuit 162, the correction circuit 165, and the correction circuit 168. The dividing circuit 163 divides the input signal by two, the dividing circuit 166 divides the input signal by eight, and the dividing circuit 169 divides the input signal by ten. The dividing circuit 169 inputs the divided 22.5-MHz clock signal into the amplifier 15.

MODIFICATION EXAMPLE 1

To make the level of the signals to be output insusceptible to the temperature variation, the amplifier 161, the amplifier 164, and the amplifier 167 may include circuits to correct the input clock signal levels to shape such that the input clock signals have waveforms of rectangular waves. For example, the amplifier 161, the amplifier 164, and the amplifier 167 are comparators that outputs high level voltages when the voltages of the input signals are greater than a reference voltage, and outputs low level voltages when the voltages of the input signals are equal to or lower than the reference voltage. The amplifier 161, the amplifier 164, and the amplifier 167 operated so as to clip the input signals on predetermined voltages ensure the levels of the voltages output by the amplifier 161, the amplifier 164, and the amplifier 167 to be maintained in a constant range, even when peak values of the input voltages varies due to the temperature variation.

MODIFICATION EXAMPLE 2

Figure 5:
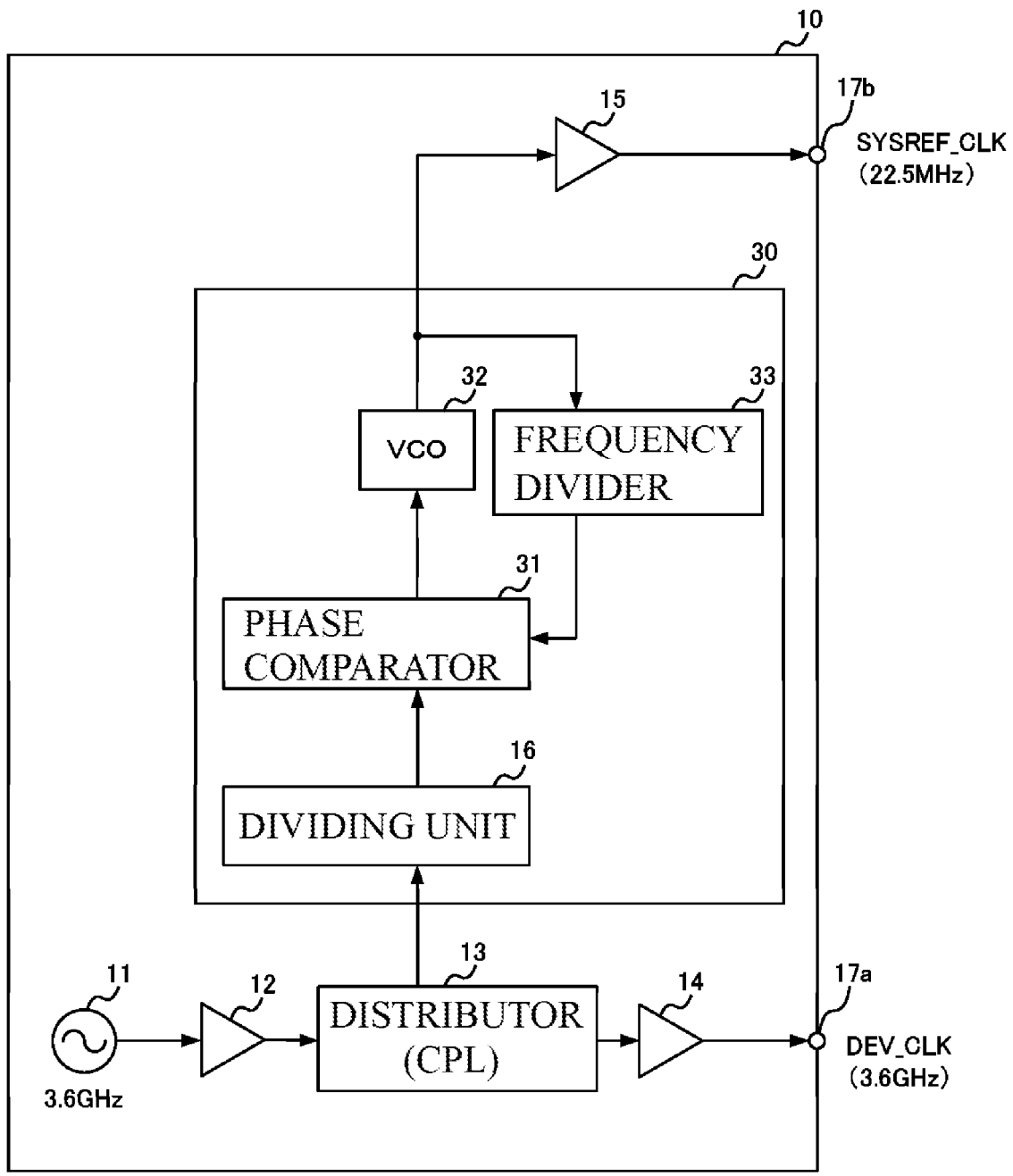
FIG. 5 is a drawing illustrating a configuration of a clock generating circuit of a modification example.

FIG. 5 is a drawing illustrating a configuration of a clock generating circuit 10 according to a Modification Example 2. The clock generating circuit 10 is different from the clock generating circuit 1 illustrated in FIG. 3 in a point that the dividing unit 16 is included in a phase locked loop 30.

The phase locked loop 30 outputs a 22.5-MHz clock signal synchronized to a 3.6-GHz clock signal input from the distributor 13. The phase locked loop 30 includes a dividing unit 16, a phase comparator 31, a voltage control oscillator (VCO) 32, and a frequency divider 33. The dividing unit 16 has a configuration identical to the dividing unit 16 illustrated in FIG. 3. The frequency divider 33 has a configuration identical to the dividing unit 16, and may include one or more amplifiers, one or more correction circuits, and one or more dividing circuits.

[Technical Effects of Clock Generating Circuit of the Embodiment]

In a conventional clock generating circuit without the correction circuit 162, the correction circuit 165, and the correction circuit 168, when the temperature is varied between 0 to 50° C., a time difference between the rising timing of the reference clock and the rising timing of the divided clock is 110.8 ps due to the level variation of the amplifier located at a former part of the frequency divider. For example, when the level of the amplifier varies by 0.81 dB, an amount of variation of the time difference is 37.8 ps.

In contrast, the dividing unit 16 included in the clock generating circuit 1 and the clock generating circuit 10 according to the embodiment includes the correction circuit between the amplifier and the frequency divider so as to reduce the level variation due to the temperature variation. This ensures the dividing unit 16 to decrease the amount of variation of the varying timing of the signal due to the temperature variation, thus reducing the variation of the amount of the jitter due to the temperature variation.

While in the present disclosure has been described above with reference to the embodiments, the technical scope of the disclosure is not limited to the scope of the embodiments described above. It is apparent that a variety of variations and modifications of the above-described embodiments can be made by those skilled in the art. It is apparent from accompanying claims that such variations and modifications may also be encompassed by the technical scope of the disclosure.

For example, while the dividing unit 16 illustrated in FIG. 3 includes a plurality of the frequency dividers and the correction circuits, the dividing unit 16 may include one frequency divider and one correction circuit. The clock generating circuit 1 may further include a flip-flop circuit at a latter part of the amplifier 15, thus latching the 22.5-MHz clock with the 3.6-GHz clock to synchronize the 22.5-MHz clock to the 3.6-GHz clock.

The correction circuit may include, for example, a thermistor having a resistance value variable depending on temperature. The correction circuit may correct the level of the input clock such that the input clock has a waveform of a rectangular wave.

The dividing unit may include a plurality of the dividing circuits and the correction circuits. The plurality of the dividing circuits are connected in cascade. The correction circuits are located at former parts of the respective plurality of the dividing circuits, and the correction circuits have identical properties.

According to a second aspect of this disclosure, the signal processing device includes a dividing unit, a distribution unit, and an analog/digital converter. The dividing unit divides a reference clock to generate a divided clock, the divided clock has a frequency of 1/N times of a frequency of the reference clock, where N is an integer of two or more. The distribution unit distributes the reference clock to a first route and a second route, the first route includes an output terminal that outputs a clock with a frequency identical to the frequency of the reference clock, the second route includes the dividing unit. The analog/digital converter performs an analog/digital conversion on a signal with a frequency between the frequency of the reference clock and the frequency of the divided clock based on the reference clock and the divided clock. The dividing unit includes one or more amplifiers, one or more dividing circuits, and a correction circuit. The correction circuit is disposed between the amplifier and the dividing circuit, and the correction circuit corrects a level of an input clock input to the dividing circuit.

This disclosure provides an efficiency to decrease the variation of the delay period of the divided clock in accordance with the temperature variation.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:
1. A clock generating circuit, comprising:
   a dividing unit that divides a reference clock to generate a divided clock, the divided clock having a frequency of 1/N times of a frequency of the reference clock, where N is an integer of two or more; and
   a distribution unit that distributes the reference clock to a first route and a second route, the first route including an output terminal that outputs a clock with a frequency identical to the frequency of the reference clock, the second route including the dividing unit,
   wherein the dividing unit comprises:
      one or more amplifiers;
      one or more dividing circuits; and
      a correction circuit, disposed between the amplifier and the dividing circuit, the correction circuit corrects a level of an input clock input to the dividing circuit.
2. The clock generating circuit according to claim 1, wherein
   the correction circuit comprises a thermistor having a resistance value variable depending on temperature.
3. The clock generating circuit according to claim 1, wherein
   the correction circuit corrects the level of the input clock such that the input clock has a waveform of a rectangular wave.
4. The clock generating circuit according to claim 1, wherein
   the dividing unit comprises:
      a plurality of the dividing circuits connected in cascade; and
      the correction circuits located at former parts of the respective plurality of the dividing circuits, and the correction circuits having identical properties.
5. A signal processing device, comprising:
   a dividing unit that divides a reference clock to generate a divided clock, the divided clock having a frequency of 1/N times of a frequency of the reference clock, where N is an integer of two or more;
   a distribution unit that distributes the reference clock to a first route and a second route, the first route including an output terminal that outputs a clock with a frequency identical to the frequency of the reference clock, the second route including the dividing unit; and
   an analog/digital converter that performs an analog/digital conversion on a signal with a frequency between the frequency of the reference clock and the frequency of the divided clock based on the reference clock and the divided clock,
   wherein the dividing unit comprises:
      one or more amplifiers;
      one or more dividing circuits; and a correction circuit, disposed between the amplifier and the dividing circuit, the correction circuit corrects a level of an input clock input to the dividing circuit.

* * * * *